United States Patent [19]
Kuehnle et al.

[11] Patent Number: 5,211,995
[45] Date of Patent: May 18, 1993

[54] METHOD OF PROTECTING AN ORGANIC SURFACE BY DEPOSITION OF AN INORGANIC REFRACTORY COATING THEREON

[75] Inventors: Manfred R. Kuehnle, Waldesruh P.O. Box 1020, Rte. 103A, New London, N.H. 03257; Arno K. Hagenlocher, Santa Rosa; Klaus Schuegraf, Rancho Palos Verdes, both of Calif.

[73] Assignee: Manfred R. Kuehnle, New London, N.H.

[21] Appl. No.: 768,159

[22] Filed: Sep. 30, 1991

[51] Int. Cl.⁵ ............................................. B05D 3/06
[52] U.S. Cl. .................................. 427/570; 427/571; 427/572; 427/573; 427/574; 427/575; 427/579
[58] Field of Search .................. 427/38, 39, 53.1, 54.1, 427/45.1, 47, 258, 314, 570, 569, 571, 572, 573, 574, 575, 576, 578, 579

[56] References Cited
FOREIGN PATENT DOCUMENTS
1-129958 5/1989 Japan .

Primary Examiner—Shrive Beck
Assistant Examiner—Roy V. King
Attorney, Agent, or Firm—Cesari and McKenna

[57] ABSTRACT

Transparent, refractory coatings and methods for their application to environmentally exposed substrates are disclosed. The coatings can be deposited over organic decorative materials, which generally prevent application of hard, protective, inorganic materials due to emission of exudates and vulnerability to excessive heat. The coatings are applied using plasma-enhanced chemical-vapor deposition techniques that reduce reaction temperatures and produce multilayer structures that seal organic exudates before a final layer of coating is applied, such multilayer protective coating structures being particularly suitable for protecting automobile bodies and the like against degrading external forces.

22 Claims, 7 Drawing Sheets

METHOD OF PROTECTING AN ORGANIC SURFACE BY DEPOSITION OF AN INORGANIC REFRACTORY COATING THEREON

BACKGROUND OF THE INVENTION

A. Field of the Invention

The present invention relates to surface coatings, and more particularly to methods and compositions for producing inorganic coatings on decorative, organic surfaces that are vulnerable to environmental exposure.

B. Description of the Related Art

Surfaces exposed to environmental degradation—that is, to the effects of light, heat, ambient chemicals and mechanical abrasion—are frequently protected by various types of surface treatments. These include application of galvanic coatings, electrochemical oxidation (anodization), and simply coating with paint. The surface-treated article typically exhibits not only greater resistance against environmental damage, but also improved aesthetic appearance.

Although the methods of applying conventional surface treatments have improved in recent years, the basic technologies have not; for example, the ingredients used in nickel plating, anodizing and painting are still essentially the same.

Unfortunately, the protection afforded by conventional surface treatments is of limited duration. Colors fade when exposed to light (particularly the highly energetic ultraviolet radiation present in sunlight); and coatings erode when exposed to airborne acids, they scratch when abraded by hard objects, and peel when subjected to cyclical weather-related thermal patterns (due to repeated expansion and contraction). Even when newly applied, the strength and stress durability of traditional coatings tends to be less than optimal.

These shortcomings are due to the nature of the materials used and the sometimes contradictory requirements of different surface coatings. Decorative effects are generally produced by layers that exhibit a particular color or otherwise hide the surface appearance of the underlying substrate; whether pigmented or dye-based, such layers usually contain organic constituents that are relatively labile. While these layers are sometimes coated with a tougher, transparent material (such as a sealer), the conditions necessary to deposit truly refractory inorganic coatings are usually incompatible with the physical and chemical susceptibilities of the decorative layer, such as deposition temperature and/or reaction with deposition gases.

Typically, the decorative layer emits exudates such as gases, vapors and low-molecular-weight plasticizers during drying; the rate of emission tends to increase significantly as the ambient temperature is raised. However, refractory inorganic coatings typically have high melting points and, consequently, such coatings must generally be applied at elevated temperatures. Because such temperatures substantially exceed the melting points of typical paints and plastic surface materials, application of such a coating to an ordinary colored layer would both degrade the colored layer and cause unwanted diffusion between the layers. In the case of application to a painted surface, the high emission rate of the latter would also interfere with proper composition and curing of the inorganic layer.

DESCRIPTION OF THE INVENTION

Brief Summary of the Invention

The present invention establishes a transparent, refractory inorganic layer to seal, almost totally protect and completely alter the surface properties of an underlying layer that is easily damaged or an undecorated but vulnerable substrate. The inorganic layer is chemically pure, optically clear, exhibits great hardness and chemical resistivity, and preferably absorbs incident ultraviolet radiation. In our preferred embodiment, the thickness of this layer is usually about 2.5 $\mu$m, or about 5% of the thickness of a typical coating of organic paint. However, despite the small proportion of overall thickness represented by the coating, it offers excellent protection against mechanical, ultraviolet radiation and/or chemical attacks.

We achieve compatibility between the decorative layer and the protective layer by creating coating conditions that facilitate the deposition of the latter at acceptable temperatures and energy densities. Specifically, precursors of the material that will form the protective layer are reacted as a plasma and then immediately applied directly to the substrate by vapor deposition, forming a stabilization or barrier zone that seals the exudates and prevents them from interfering with further buildup of coating. In one embodiment, the deposition process, which occurs in a vacuum chamber at moderate temperatures, is momentarily interrupted after the protective layer has accumulated to a thickness of a few hundred angstroms. This stabilization layer or zone is then exposed to oxygen and irradiated with actinic radiation, thereby curing the material and trapping the decorative layer (and its exudates) beneath the now-hardened "skin". Deposition is then recommenced and continued until the protective layer reaches a desired thickness.

Ordinarily, elevating the temperature of an organic decorative layer for extended periods of time results in significant exudate emission and degradation, a condition that would prevent growth of a pure inorganic layer thereover; in fact, the exudates would severely degrade the quality of such a layer through chemical contamination, and possibly damage the decorative layer as well. However, with the underlying decorative layer insulated by a stabilization layer, exudates cannot interfere with further buildup of the inorganic layer, and the moderate temperatures associated with vapor deposition cause little (if any) damage to the underlying decorative layer. These moderate temperatures are achieved by energizing the chemical-vapor source or sources to an intense plasma state using an electronic or radiational source rather than thermal energy.

Accordingly, creation of the stabilization layer separates the workpiece into organic and inorganic zones, and facilitates combination of the moderate-temperature process of coating with a low-temperature process such as painting; the detrimental effects ordinarily associated with differential process temperatures are thus eliminated. Furthermore, the material of the protective layer can be combined with dopants to enhance particular properties such as absorption of ultraviolet radiation, or with a progressively decreasing quantity of carbon-containing material to produce a graded coating.

In another embodiment, exudates from the decorative layer are trapped by treating them with a gas mixture that causes them to react chemically and become stabilized in a progressively embedded barrier zone in the growing protective layer. Deposition is then continued past the point at which accumulation of the protective layer completely contains the exudates until the desired coating thickness is reached. Although this method eliminates the need to interrupt deposition and vary the temperature of the deposition chamber to produce a stabilization skin, its success and the degree of deposition required for exudate containment depends heavily on the composition, condition and heat-tolerance of the underlying decorative layer; accordingly, it can be more difficult to control.

The coating material is desirably clear and glossy, as well as ultraviolet-absorptive, abrasion-resistant, chemically inert and internally cohesive; polycrystalline silica is a preferred coating. With either deposition method, the final coating bonds firmly to the decorative layer and, in concert with the energy-absorbing layer beneath, behaves resiliently under mechanical impact.

BRIEF DESCRIPTION OF THE DRAWINGS

The foregoing discussion will be understood more readily from the following detailed description of the invention, when taken in conjunction with the accompanying drawings in which.

DETAILED DESCRIPTION OF THE INVENTION

The coatings of the present invention are formed and applied using plasma-enhanced chemical-vapor deposition; a vapor of the coating material is formed in situ by electronic or radiational excitation and deposited onto the substrate in the gaseous state. Because energy is supplied by an electromagnetic field, high-temperature thermal processes are avoided, and deposition of a high-quality inorganic coating occurs at relatively low temperatures. Excitation of reactant gases produces reactive molecules and ions, which collide to form molecules of the coating material. As described more fully below, excitation sources can include microwave generators, radio-frequency generators, electron-cyclotron resonators, mercury-vapor lamps, excimer lasers and synchrotron radiators.

Most of our techniques involve combining the reactant gases in one or more cavities contained within a larger chamber that also holds the substrate to be coated. Each cavity is positioned proximate to the substrate. In the preferred embodiments, a first reactant gas is introduced into each cavity and excited to form a plasma; a second reactant gas is then introduced across the front aperture of each cavity. The excited molecules and ions of the first reactive gas diffuse out the front aperture, and there encounter and react chemically with the molecules of the second gas to form gaseous molecules of the inorganic coating material. These molecules continue to diffuse outward to deposit on the substrate.

Figure 1:
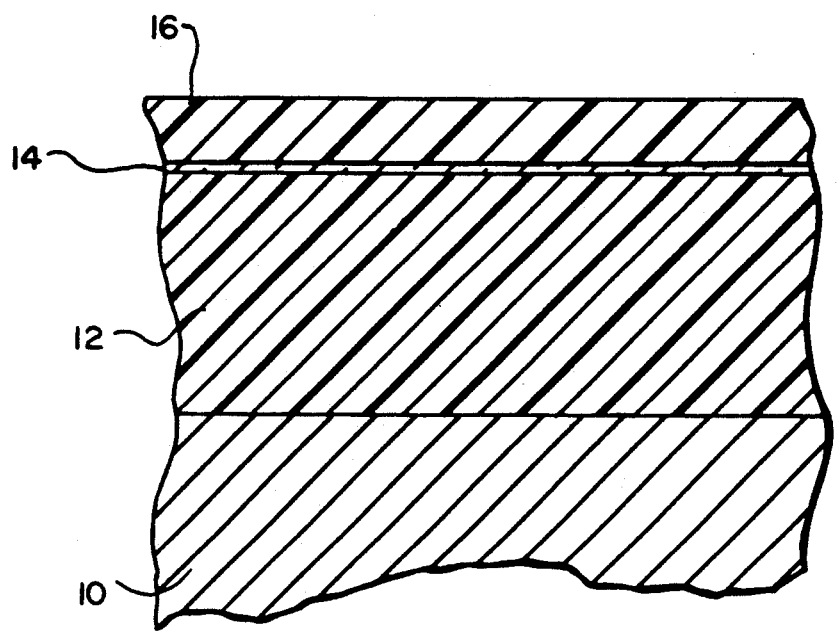
FIG. 1 is a sectional view of a substrate coated with a protective layer, preferably silica using $SiH_4$ and $N_2O$ as reactants.

Our best results, in terms of optical clarity, hardness and chemical resistance, have been achieved with a silica ($SiO_2$) coating. In a first embodiment, silane ($SiH_4$) is introduced into each cavity as the primary reactant gas and nitrous oxide ($N_2O$) as the secondary reactant gas; these materials react in a plasma state to form $SiO_2$, ammonia ($NH_3$) and nitrogen gas ($N_2$). The latter two compounds are collected from the reaction zone and pumped out of the system. A significant feature of this embodiment is the formation of a thin stabilization layer that is properly treated with ultraviolet radiation and oxygen to form a skin, after which deposition is continued to form the protective layer. FIG. 1 depicts the results of this process. A substrate 10 is coated with a decorative layer 12; if the substrate is metal and the decorative material paint, the thickness of layer 12 will usually be around 50 $\mu$m. The stabilization layer, indicated by reference numeral 14, involves an initial application of silica coating to a thickness of about 0.05 to 0.1 $\mu$m. At this point, the deposition process is interrupted and substrate 10 allowed to cool as the stabilization layer is irradiated with ultraviolet light for 30 to 60 sec in the presence of oxygen. This process hardens the stabilization layer into a "skin". Deposition is then continued to form the final coating layer 16, preferably to a thickness of about 2 $\mu$m. This process is also suitable for uncoated substrates (e.g., colored plastic).

The silane/nitrous-oxide system can be replaced with other suitable silica-forming reactants. For example, gaseous dichlorosilane, trichlorosilane and silicon tetrachloride can be used instead of silane, with oxygen as the secondary gas.

Additives or dopants can be introduced into the secondary gas stream to enhance selected physical properties of the coating. For example, small amounts of boron or phosphine compounds are added to increase the ability of the coating to absorb ultraviolet radiation, thereby retarding degradation of decorative layer 12 (or an uncoated substrate) as a result of exposure to sunlight.

Use of silane and nitrous oxide produces a fully inorganic layer; small amounts of deposited, unreacted starting material do not appreciably interfere with the hardness of the coating. However, it is sometimes desirable to introduce an organic component into the coating and into the interface between the substrate and the coating in order to increase elasticity and mechanical shock absorption, but without degrading performance. We accomplish this by creating a graded silica layer containing an organic component whose concentration is progressively reduced as the coating is deposited.

Figure 2:
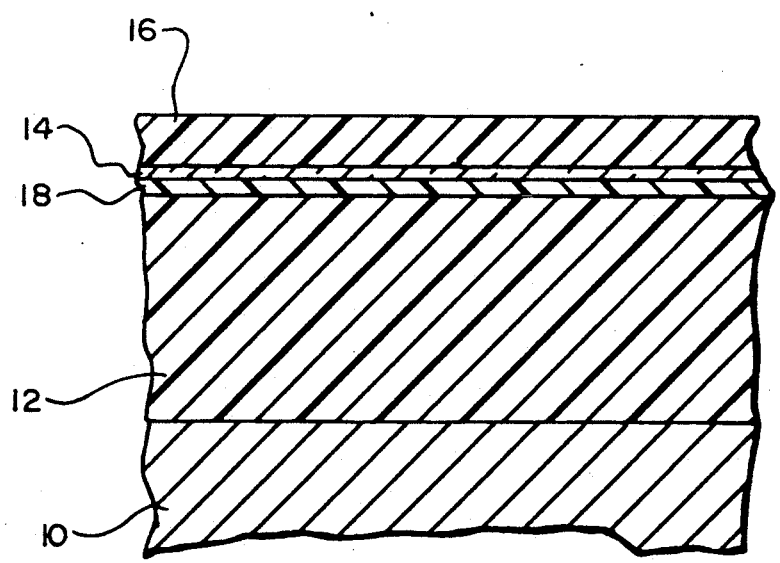
FIG. 2 is a sectional view of a substrate coated with silica and provided with a graded organic intermediate layer and a stabilization skin.

The organic component is introduced by utilizing an organosilicon compound as a source of silicon atoms, and progressively increasing the amount of secondary gas (to increase the yield of silica) until nearly pure silica is deposited. Thus, organosilicon reactants such as gaseous tetraethylorthosilicate (TEOS), diacetoxydi(-tertiary butoxy)silane (DABS), hexamethyldioxysilane (HMDS), methyltrimethoxysilane (MTMO) or vinyl-trimethoxysilane (VTMO) are combined with increasing amounts of oxygen (which may or may not contain dopants or additives) to create a graded layer 18 above decoarative layer 12, as shown in FIG. 2. The combined thickness of graded layer 18 and stabilization layer 14 is preferably about 0.1 μm. At the interface between graded layer 14 and decorative layer 12, the properties of graded layer 14 resemble those of an organic polymer, While stabilization layer 14 consists almost entirely of pure silica. The skin-creation and final-coating processes are performed in the manner described above in connection with FIG. 1.

Figure 3:
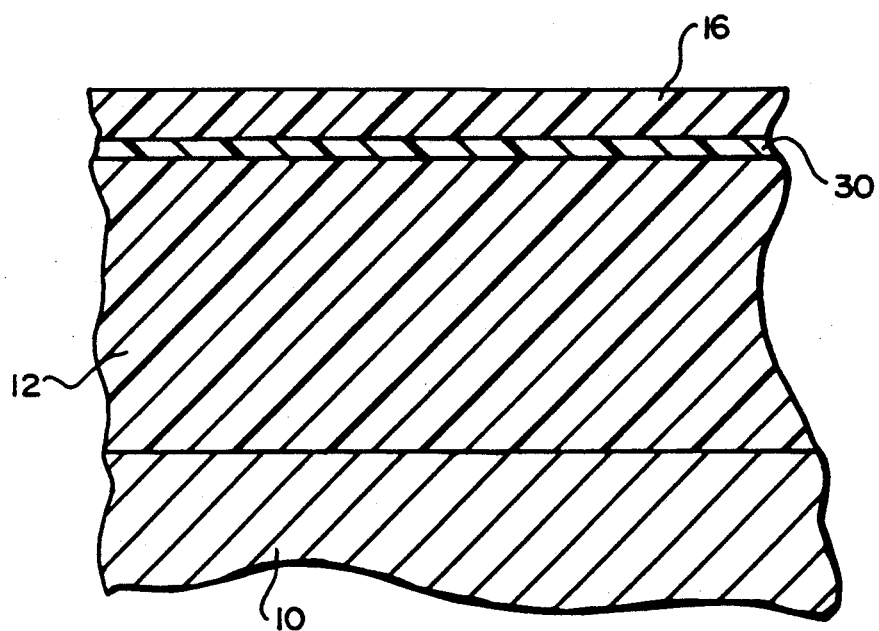
FIG. 3 is a sectional view of a substrate provided with a graded organic intermediate layer but without the stabilization skin.
Figure 4:
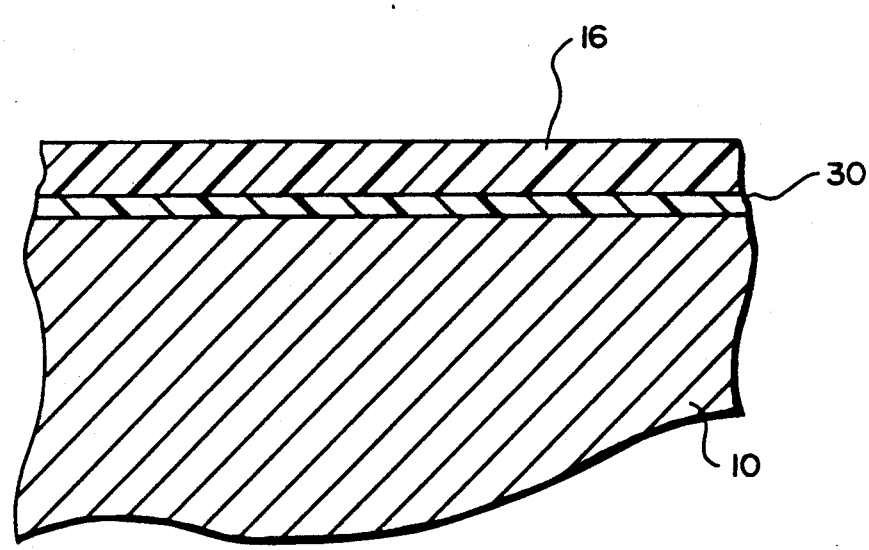
FIG. 4 is a sectional view of a substrate to which a protective layer is applied directly.

FIGS. 3 and 4 illustrate the results of applying the second embodiment of the invention. In FIG. 3, a graded layer 30 is applied decorative layer 12, much in the manner described above in connection with layer 18. However, during deposition of this layer, it is exposed to a gas mixture that causes the emerging exudates to react chemically and become embedded in layer 18 as it grows. As the material of layer 18 accumulates, the gas mixture is progressively altered in relation to the exudates until they are sealed and passivated. The deposition process continues until a desired thickness of exudate-free coating is deposited.

Preferred reactive gases are nitrous oxide or oxygen, the same species used to create the coating. As the energetic molecules of the coating are applied to the substrate, the exudates react With the deposited material or ambient reactants as deposition progresses. Naturally, the point at Which the exudates are fully contained depends on the nature of the substrate and the deposited material. Determination of this point to optimize use of the process may require some degree of repetition and analysis.

FIG. 4 illustrates the results of applying this second embodiment to an uncoated substrate 10 (which can be, for example, plastic).

Excitation and reaction of the starting materials can be accomplished in a number of different ways. For reasons discussed in greater detail below, our preferred method is to create a plasma using electric-field resonance. However, we have also achieved successful results using electron-cyclotron resonance and radio-frequency excitation sources.

1. Electric-Field Resonance Embodiment

Figure 5:
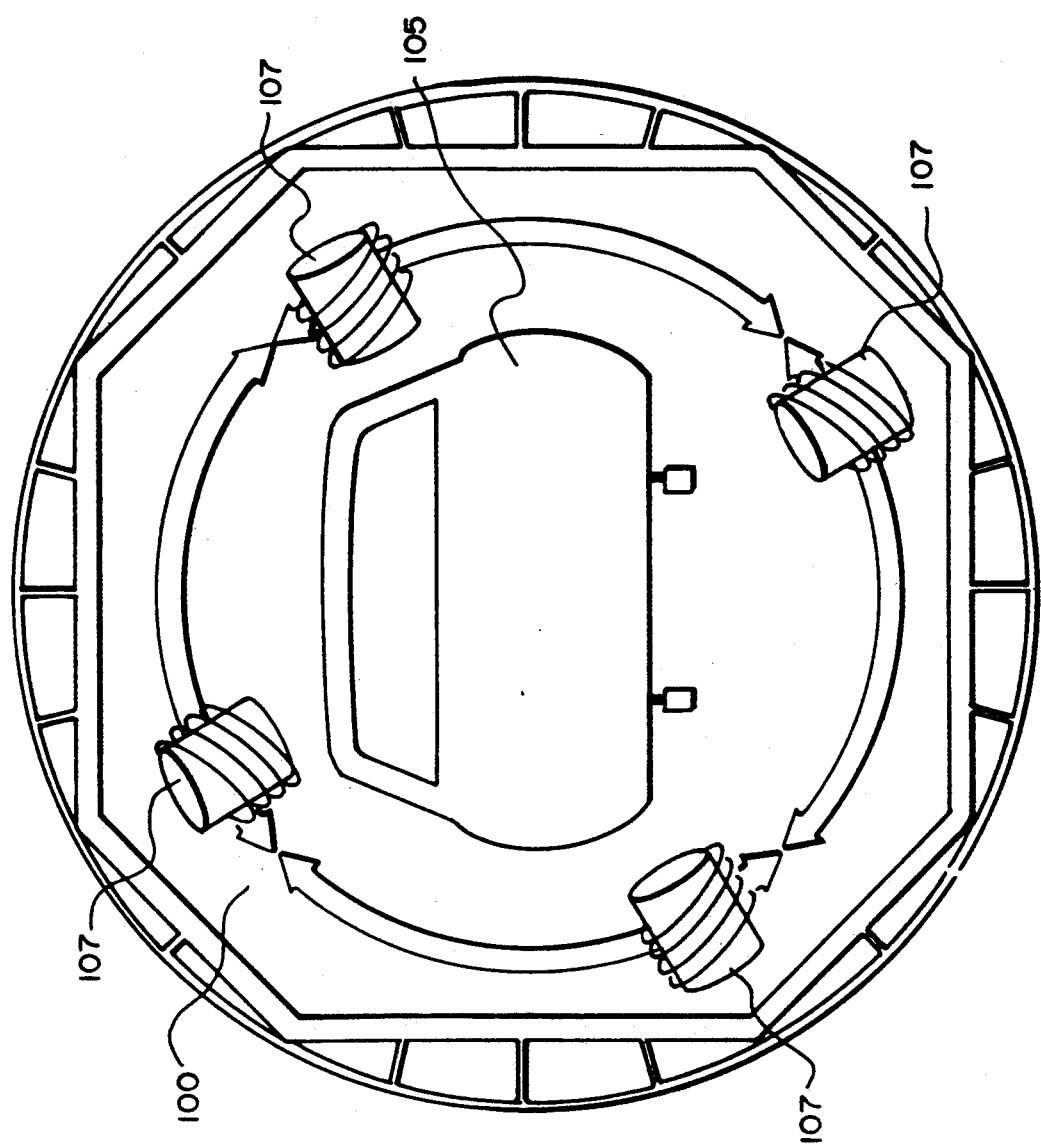
FIG. 5 is a sectional, schematic depiction of a multi-cavity apparatus that can be used to coat, for example, the illustrated automobile body.

With this technique, one or more resonant cavities are energized by microwave radiation to generate a plasma from the primary reactant gas, causing them to undergo chemical combination. A representative configuration for applying this approach to substrate coating is shown in FIG. 5. The illustration schemically depicts a vacuum chamber 100 containing a substrate 105 and four resonant cavities 107, which surround substrate 105 and are independently movable over its contour. A controller, not shown, directs the movement of each cavity 107 over the contour of substrate 105. If more than one coating is to be applied, cavities 107 can each be assigned to an individual portion of the substrate contour, or the controller can be configured to maintain an equidistant spatial orientation among cavities 107 as they each cover overlapping areas on the contour, thereby maximizing the cooperative effect of multiple, simultaneously operative coating sources.

During operation, the pressure in chamber 100 is preferably reduced to about 1 torr (although, as discussed below, increased pressures can be employed), and the substrate heated to a temperature in the range 100 to 150° C. When these conditions have been achieved, cavities 107 are energized and brought into operation, and then passed over the contour of substrate 105 in the manner described above.

Figure 6:
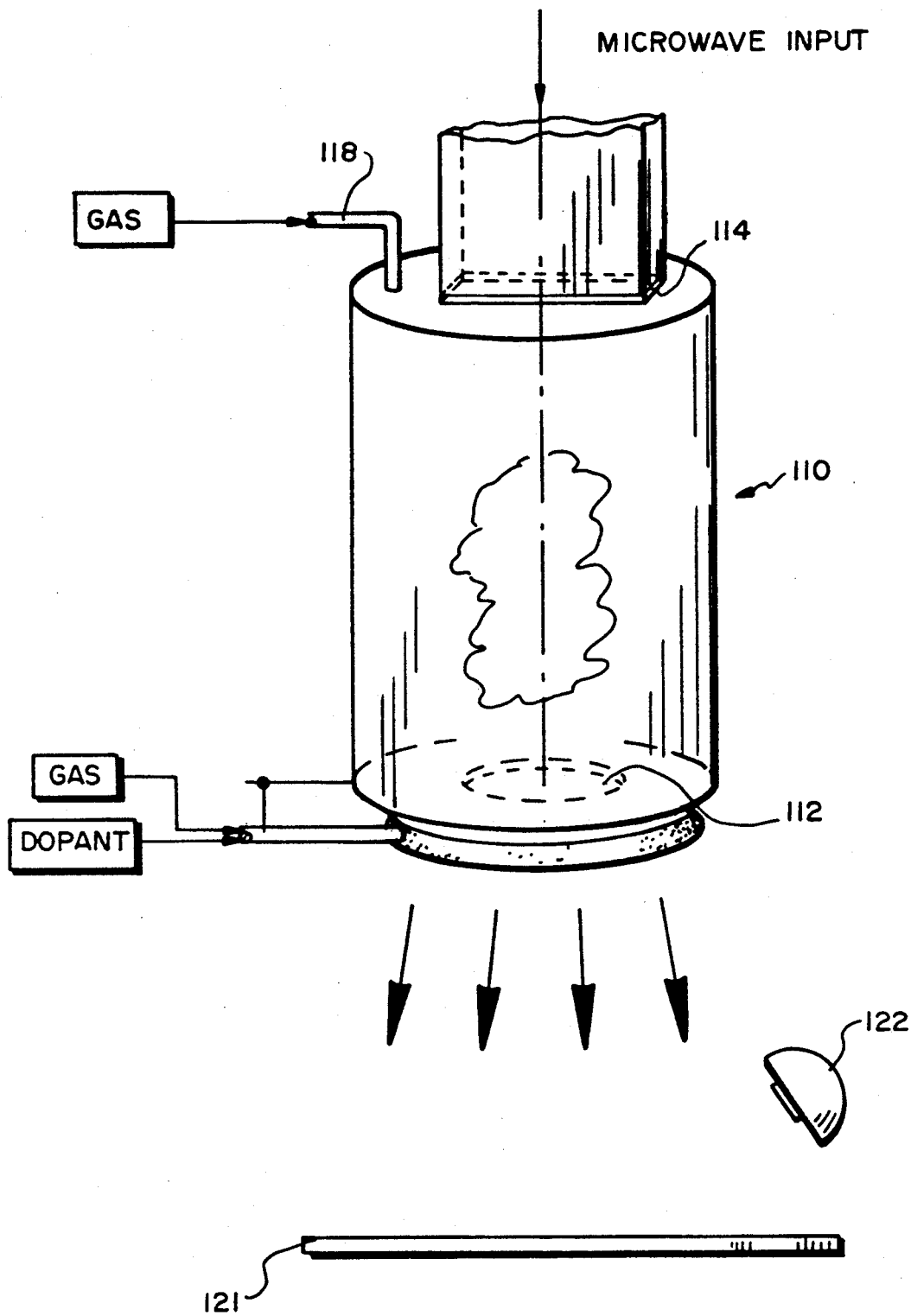
FIG. 6 is a more detailed view of one of the cavities shown in FIG. 5, configured to produce a plasma by electric-field resonance.

A more detailed view of each cavity 107 is shown in FIG. 6. As illustrated therein, a cylindrical vessel 110 is provided with a forward aperture 112 and a refractory (preferably quartz) window 114 for admitting microwave radiation therein. A first gas inlet 118 feeds the primary gas into vessel 112 near the microwave-input window 114, while a second gas source 120, configured as a porous ring line, surrounds aperture 112 at the exterior of vessel 110 and evenly directs the secondary gas or gas mixture toward this aperture.

To energize the cavity, a microwave source is activated and its output directed through window 114; the frequency of the radiation is coordinated with the dimensions of vessel 110 so that internal resonance is achieved within the cavity. The first gas is introduced through inlet 118 into vessel 110, where it is transformed into a plasma state. The excited gas species emerge through aperture 112, encountering and reacting with the second gas discharged through gas source 120. The newly formed molecules of coating material (along with any unreacted starting components) diffuse away from aperture 112 toward the substrate 121, where they deposit as a coating.

Preferred operating conditions for this embodiment are as follows:

| | |
|---|---|
| Silane (first gas) | 400 cm$^3$/min |
| Oxygen (second gas) | 600 cm$^3$/min |
| Microwave power | 500–800 watts |
| Microwave frequency | 2.45 GHz |
| Vacuum-chamber pressure | 1 torr |
| Silica-generation rate | 0.5 g/min |
| Substrate temperature | 150° C. |

Under these conditions, each cavity 107 can deposit coating at the rate of 3000–5000 Å/min per square meter of substrate surface. Accordingly, a coating thickness of 1 μm will take 2–3 min/m$^2$ to grow.

Also shown in FIG. 6 (and omitted for clarity in the remaining illustrations) are a source of actinic (e.g., ultraviolet) radiation 122, a source of oxygen 124 and a gas-mixture source 126. Radiation source 122 and oxygen source 124 are activated to form a stabilization skin, as described above. Alternatively, gas-mixture source 126 can be used to progressively embed exudates in the growing deposition layer, also as described above.

Performance can be increased by improving the resonance characteristics of vessel 110 (e.g., by minimizing impedance to obtain high field strengths) and/or increasing the power output of the microwave source, which increases the rate of plasma generation and, therefore, permits the use of greater gas pressures to produce greater output volumes. The resulting rise in operating pressures (increasing the deposition rate by a factor of 10 allows the internal pressure to rise to 100 torr) facilitates use of lower-cost vacuum-pumping equipment, further contributing to the cost-effectiveness of the technique.

The effectiveness of deposition can be enhanced by applying a negative electrical bias between the substrate and vessel 110. Such a bias acts as a counterforce to the deposition by actually removing part of the deposited material. Since less effectively bound molecules are preferentially removed by the bias, a higher-quality coating can be obtained. Additionally, the amount of bias applied strongly influences the internal stress of the coating film; by adjusting the magnitude of the bias, the coating can be made more or less tensile or compressive. In this fashion, both coating and substrate can be stress-compensated as a unitary system.

For conductive substrates, vessel 110 is constructed so as to remain electrically isolated from the substrate. The bias source can be a direct-current power supply connected between the substrate and vessel 110, and having a voltage output between 0 and −50 volts. Alternatively, the bias source can be a high-frequency generator; a preferred operating frequency is 13.54 MHz. Because of the different geometrical sizes of various substrates and coating vessels and the different mobilities of ions and electrons in a plasma, the radiofrequency field gives the appearance of a negative direct-current voltage between the substrate and vessel 110. Use of a radio-frequency field is preferred in cases where the substrate is an insulator or weakly or poorly conductive (e.g., heavily coated metals, plastic materials and ceramics).

2. Electron-Cyclotron Resonance Embodiment

The foregoing approach can be modified to utilize electron-cyclotron resonance (ECR), rather than field resonance, as the source of energy for plasma generation. More specifically, ECR is used to accelerate electrons to high energies at very localized positions. In this process, the electrons travel along circular paths during their acceleration. Each electron thereby develops an angular momentum, and also exhibits the characteristics of a magnetic dipole. This dipole interacts with the gradient of a decreasing magnetic field so that the electron is extracted along the direction of the field gradient, which is oriented so as to lead the electron out of the ECR chamber. Along their paths of travel, the electrons collide with molecules of the primary reactant gas to generate a plasma, which includes ionized reactant species. Extraction of the electrons produces an electric-field gradient which causes the ions to follow the electrons along the field gradient and out of the chamber. After they emerge, the excited primary-reactant species react with the secondary gas outside the ECR chamber.

Figure 7:
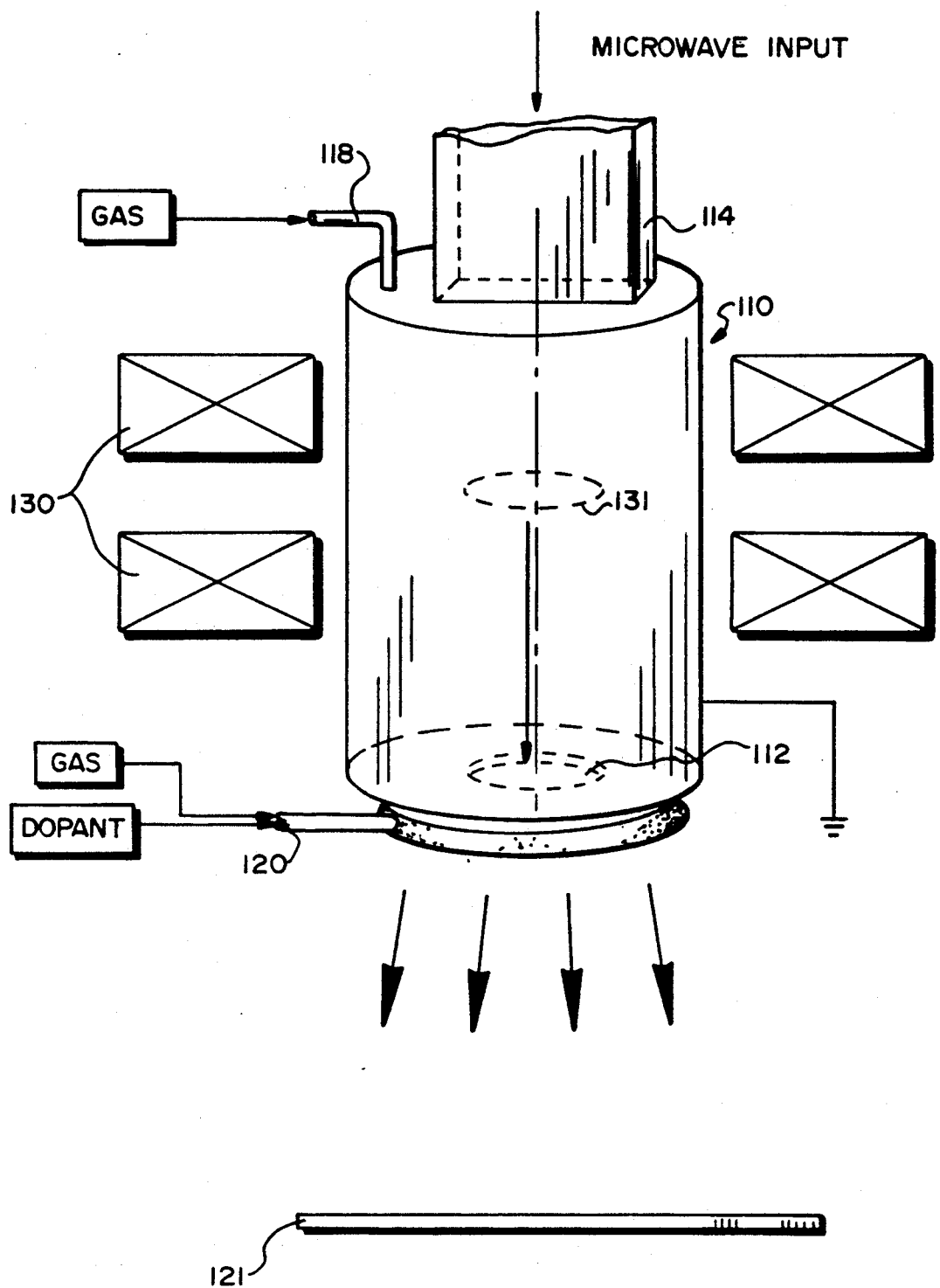
FIG. 7 is a more detailed view of one of the cavities shown in FIG. 5, configured to produce a plasma by electron-cyclotron resonance.

Obtaining ECR requires modification of the cavity design to provide a magnetic field, and a suitable configuration is schematically illustrated in FIG. 7. To the cavity design depicted in FIG. 6 has been added a magnetic source (shown sectionally and indicated by reference numeral 130) that is cylindrically symmetrical with respect to vessel 110, thereby creating field lines that run axially therethrough. Microwave energy is supplied to vessel 110 (which is grounded) through window 114, creating an electric field that oscillates in a plane perpendicular to the axis of vessel 110 and the magnetic field lines created by magnetic source 130. Electrons dislodged from molecules of the first gas entering through inlet 118, which are accelerated by the electric field in a direction perpendicular to the magnetic field lines, therefore follow a circular path about the axis of vessel 110. The sinusoidal frequency of the microwave radiation interacts with the magnetic field so that the electrons are accelerated through a progressively larger circular path, and gain energy in the process. The buildup of energy is limited primarily by the distance the acclerated electrons can travel without collision.

The physical dimensions of magnetic source 130 are chosen so that the magnetic field is most intense near the center of vessel 110, as indicated by reference numeral 131, but decreases along its axis in the direction of aperture 112. Electrons and ions are extracted along the field gradient as described above so that they emerge from vessel 110 through aperture 112.

The effectiveness of this process is highly dependent on the pressure within vessel 110 (which itself depends on the efficiency of the vacuum equipment and the pressure at which the reactant gases are introduced). If the pressure is too low, too few collisions will occur to create the plasma state, while excessive pressures reduce the mean free path of an electron to distances too small to allow sufficient buildup of energy. At a pressure of about $2 \times 10^{-4}$ torr, the mean free path of an electron is approximately 50 cm, large enough to create a plasma.

As in the previously described embodiment, the secondary gas is introduced through a ring line just outside aperture 112, where the reaction takes place. Once again, due to the energetic intensity of the deposited vapor, the substrate is heated only modestly, to 100°–150° C.

Preferred process parameters for this embodiment are as follows:

| | |
|---|---|
| Silane (first gas) | 40 cm³/min |
| Nitrous oxide (second gas) | 60 cm³/min |
| Microwave power | 200 watts |
| Microwave frequency | 2.45 GHz |
| Static magnetic field | 875 gauss |
| Vacuum-chamber pressure | $2 \times 10^{-4}$ torr |
| Silica-generation rate | 0.05 g/min |
| Substrate temperature | 150° C. |

Under these conditions, each cavity 107 can deposit coating at the rate of 300–500 Å/min per square meter of substrate surface. Accordingly, a coating thickness of 1 μm will take 20–30 min/m² to grow.

The foregoing cavity design can be modified to accommodate reactants that are not easily produced in gaseous form, such as metal species. In this variation, an inert gas is introduced into the cavity and energized as described above to produce a plasma. The energized inert-gas ions and molecules bombard a solid target of reactant material located near the exit aperture, thereby sputtering the material, which combines with another reactant introduced in gaseous form just beyond the target.

Figure 8:
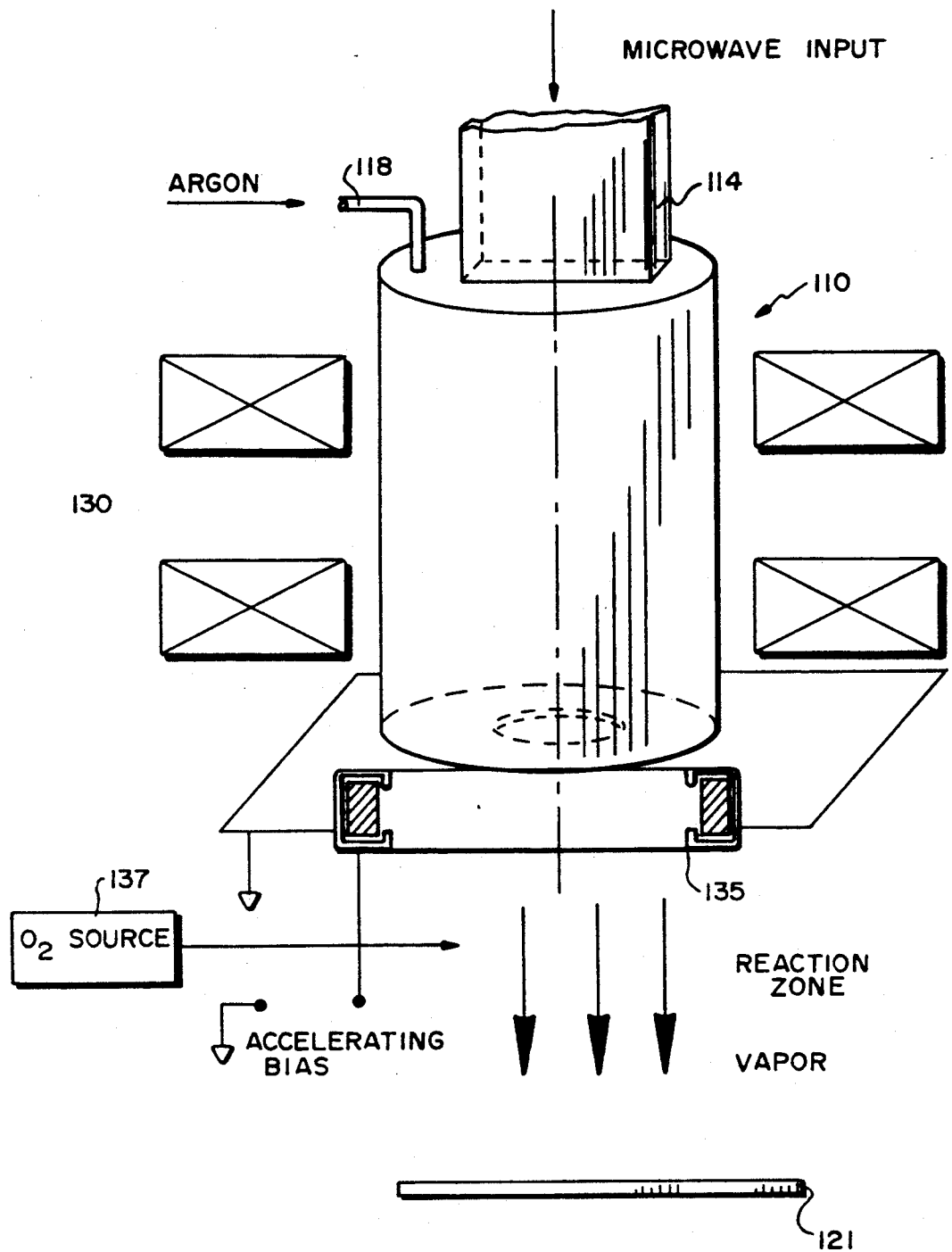
FIG. 8 illustrates a modification of the cavity shown in FIG. 5, which can produce reactant gas by sputtering a solid target of starting material.

The modified design is illustrated in FIG. 8, which will be described in connection with production of a sapphire ($Al_2O_3$) coating from aluminum and oxygen precursors. The inert gas, preferably argon, is fed through inlet 118 and, when energized, forms a plasma of argon ions and excited argon atoms within vessel 110. The plasma species are directed toward a ring-like aluminum target 135 (shown in section), sputtering metallic vapor toward the substrate 121. A source 137 of oxygen gas directs the gas into the flow of metallic vapor issuing from target 135. The oxygen and sputtered aluminum react to produce the sapphire coating, which is deposited onto substrate 121. A bias is connected between target 135 and the walls of vessel 110 in order to move the sputtered material away from the area of target 135. Optionally, a second bias can be applied between the walls of vessel 110 and the substrate to provide stress-compensation, as described above. Either of these biases can be applied using a direct-current or radio-frequency source.

3. Parallel Electrodes Embodiment

The foregoing techniques are used primarily with reactant gases that react readily to form high product yields. Even using the sputtering modification described above, the efficiency of such discharge systems degrades if the yield is too low; the need to maintain vacuum conditions and keep the plasma energized limits the reaction rate, while losses from diffusion during deposition can become significant if the effusion rate from the cavity is too small.

To accommodate these constraints, the cavity can be replaced with a contoured electrode whose shape largely matches that of the substrate; reactant gases are introduced into the space between the substrate and the electrode, which act to limit diffusion losses by containing the gaseous reaction in proximity to the substrate, thereby limiting diffusion losses. Electromagnetic energy in the radio-frequency range, applied between the substrate and the electrode, produces the plasma necessary for reaction. The energized reactant species combine to form the coating, which is contained in the gap between the substrate and the electrode and deposits on the substrate by diffusion.

Figure 9:
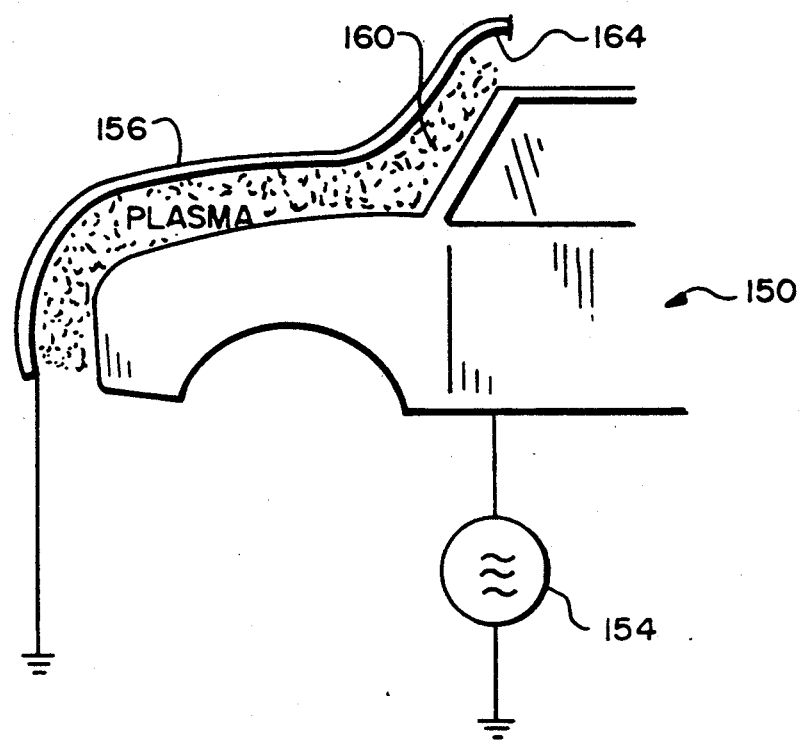
FIG. 9 is a sectional view of a substrate and matching electrode that contain the reactive plasma around the surface of the substrate.

A suitable configuration for this technique is shown FIG. 9. A substrate 150, in this case an automobile body, is connected to a radio-frequency source 154; the latter is also connected to ground. An electrode 156 surrounds at least part of substrate 150, and is also connected to ground. Reactant gases are fed into the gap 160 between electrode 156 and substrate 150; this can be accomplished, for example, using porous feed lines disposed along the inner surface 164 of electrode 156. We have obtained highly advantageous results using a 13.54 MHz radio-frequency source. If the substrate is conductive, an electrical bias can be also applied to the substrate to enhance the effectiveness of deposition.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed. For example, as noted above, it is possible to use mercury-vapor lamps, excimer lasers or synchrotron radiators to excite, directly or indirectly, the starting materials into a reactive state. For direct excitation, radiation of wavelengths below 200 nm is generally necessary, and can be produced using appropriately configured equipment of any of the foregoing types. Indirect excitation can be achieved using lower-energy (i.e., longer-wavelength) radiation sources in conjunction with an energy-transfer species such as mercury. The energy-transfer species is combined, in vapor form, with the reactants, and exposed to actinic radiation (for example, the 254 nm mercury line from a standard mercury lamp). Collisions among the excited mercury species and the reactant molecules results in transfer of energy to the reactants, which combine to form the coating compound. In practice, the source of radiation is scanned over the surface to be coated, producing the reactions that lead to coating deposition.

The invention can also be used to deposit other materials. For example, it is possible to apply $Si_3N_4$ using silicon and nitrogen precursors, or $TiN_2$ using titanium and nitrogen precursors.

What is claimed is:

1. A method of protecting an organic surface by deposition of a refractory inorganic coating thereon, comprising the steps of:
   a. introducing the surface into a sealed chamber and creating a vacuum therein;
   b. creating a plasma of at least one gaseous precursor in a cavity having an exit member proximate to the surface and contained within the chamber, so that the plasma reacts with at least one other gaseous precursor and produce a deposition vapor;
   c. exposing the surface to the deposition vapor as it diffuses away from the cavity exit so as to build progressively on the surface said inorganic coating;
   d. interrupting deposition and treating the coating to create a layer substantially impermeable to gaseous exudates emanating from the surface; and
   e. recommencing deposition until the overall thickness of the coating reaches a final level.

2. The method of claim 1 further comprising the step of introducing an unreactive dopant into the deposition vapor.

3. The method of claim 1 further comprising the steps of introducing a progressively decreasing quantity of carbon-containing material into the deposition vapor to produce a stoichiometrically graded coating.

4. The method of claim 1 wherein the deposited material is silica.

5. The method of claim 1 wherein the deposited material is sapphire.

6. The method of claim 1 wherein the deposited material is $Si_3N_4$.

7. The method of claim 1 wherein the deposited material is $TiN_2$.

8. The method of claim 1 wherein the plasma is created using electric-field resonance.

9. The method of claim 1 wherein the plasma is created using electron-cyclotron resonance.

10. The method of claim 1 wherein the plasma is created using a mercury-vapor lamp.

11. The method of claim 1 wherein the plasma is created using a synchrotron radiator.

12. The method of claim 1 wherein the plasma is created using an excimer laser.

13. The method of claim 1 further comprising the step of biasing the substrate to enhance the effectiveness of deposition.

14. The method of claim 13 wherein the bias is a produced by a power supply having a voltage output between 0 and −50 volts.

15. The method of claim 13 wherein the bias is produced by a radio-frequency source 16. The method of claim 1 wherein the impermeable layer is created by reducing the substrate temperature and exposing the coating to oxygen and actinic radiation.

17. A method of protecting a an organic surface having curved contours by deposition of a refractory coating thereon, comprising the steps of:

a. introducing the surface into an evacuated chamber;
b. disposing an electrode, whose shape complements the contours of the surface, proximate to but not in contact with the surface;
c. creating a plasma of gaseous precursors in the space to react and produce a deposition vapor that settles onto the surface to form said inorganic coating;
d. interrupting deposition and treating the coating to create a layer substantially impermeable to gaseous exudates; and
e. recommencing deposition until the overall thickness of the coating reaches a final level.

18. The method of claim 17 where the plasma is created using a radio-frequency source.

19. A method of protecting an organic surface by deposition of an inorganic, transparent, refractory coating thereon, comprising the steps of:
a. introducing the surface into an evacuated chamber;
b. energizing an inert gas to create a plasma in a vessel contained within the chamber;
c. bombarding a solid target with the plasma to sputter the target material;
d. combining the sputtered material with a reactant gas to produce a deposition vapor;
e. exposing the surface to the deposition vapor as it diffuses away from the vessel to deposit said inorganic coating on the surface;
f. interrupting deposition and treating the coating to create a layer substantially impermeable to gaseous exudates; and
g. recommencing deposition until the overall thickness of the coating reaches a final level.

20. The method of claim 19 wherein the inert gas is argon.

21. The method of claim 19 wherein the target is aluminum and the reactant gas is oxygen.

22. A method of protecting an organic, decorative surface by deposition of a refractory inorganic coating thereon, comprising the steps of:
a. introducing the surface into a sealed chamber and creating a vacuum therein;
b. creating a plasma of at least one gaseous precursor in a cavity having an exit member proximate to the surface and contained within the chamber, so that the plasma reacts with at least one other gaseous precursor and produce a deposition vapor;
c. exposing exudates from the surface to at least one reactive gas to form a stabilization layer;
d. exposing the surface to the deposition vapor as it diffuses away from the cavity exit so as to build progressively on the surface said inorganic coating; and
e. continuing deposition until the exudates are contained and the overall thickness of the coating reaches a final level.

* * * * *